United States Patent
Fallon

(10) Patent No.: US 9,298,871 B1
(45) Date of Patent: Mar. 29, 2016

(54) METHOD AND SYSTEM FOR IMPLEMENTING TRANSLATIONS OF PARAMETERIZED CELLS

(75) Inventor: Elias L. Fallon, Allison Park, PA (US)

(73) Assignee: Cadence Design Systems, Inc., San Jose, CA (US)

( * ) Notice: Subject to any disclaimer, the term of this patent is extended or adjusted under 35 U.S.C. 154(b) by 275 days.

(21) Appl. No.: 13/333,929

(22) Filed: Dec. 21, 2011

(51) Int. Cl.
- *G06F 17/50* (2006.01)
- *G06F 11/36* (2006.01)
- *G06F 9/45* (2006.01)

(52) U.S. Cl.
CPC .......... *G06F 17/5072* (2013.01); *G06F 17/505* (2013.01); *G06F 8/443* (2013.01); *G06F 11/3664* (2013.01)

(58) Field of Classification Search
None
See application file for complete search history.

(56) References Cited

U.S. PATENT DOCUMENTS

| | | | | |
|---|---|---|---|---|
| 6,078,736 A * | 6/2000 | Guccione | | 716/117 |
| 6,314,429 B1 * | 11/2001 | Simser | | 717/163 |
| 6,557,156 B1 * | 4/2003 | Guccione | | 716/117 |
| 7,007,258 B2 * | 2/2006 | Li | | 716/122 |
| 7,139,995 B1 * | 11/2006 | James-Roxby et al. | | 716/104 |
| 7,150,011 B2 * | 12/2006 | Ha et al. | | 717/148 |
| 7,506,277 B1 * | 3/2009 | Arora et al. | | 716/122 |
| 7,512,911 B1 * | 3/2009 | Goren et al. | | 716/103 |
| 7,587,694 B1 * | 9/2009 | Henrickson et al. | | 716/122 |
| 7,698,662 B1 * | 4/2010 | Wu et al. | | 716/104 |
| 7,761,829 B1 * | 7/2010 | Jayachandran et al. | | 716/130 |
| 7,971,175 B2 * | 6/2011 | Ginetti et al. | | 716/136 |
| 8,046,730 B1 * | 10/2011 | Ferguson et al. | | 716/139 |
| 8,312,410 B2 * | 11/2012 | Foster et al. | | 716/136 |
| 8,527,934 B2 * | 9/2013 | Ginetti et al. | | 716/132 |
| 8,726,209 B1 * | 5/2014 | Lamant et al. | | 716/111 |
| 2004/0133861 A1 * | 7/2004 | Bollano et al. | | 716/4 |
| 2009/0064061 A1 * | 3/2009 | Gernhoefer et al. | | 716/2 |

OTHER PUBLICATIONS

James A. Farrell, Compiler Basics: The Anatomy of A Compiler, Aug. 1995, 50 pages [online], retrieved on Apr. 3, 2013]. Retrieved from the Internet<URL: http://www/cs/man.ac.uk/~pjj/farrell/compmain.html>.*

* cited by examiner

*Primary Examiner* — A. M. Thompson
(74) *Attorney, Agent, or Firm* — Vista IP Law Group, LLP

(57) ABSTRACT

Disclosed is a method and system for translating parameterized cells (pcells) that are created using different programming languages. The pcell source code created in a first programming language undergoes a translation process to translate that source code to a second programming language. A validation process is also provided to ensure the correctness of the translations.

24 Claims, 7 Drawing Sheets

METHOD AND SYSTEM FOR IMPLEMENTING TRANSLATIONS OF PARAMETERIZED CELLS

FIELD

The invention relates to the implementation of electronic designs, such as the design of Integrated Circuits (ICs).

BACKGROUND

Complex structures in an electronic design are often automatically generated from a set of parameters. A common example of an approach to implement such complex designs with parameters is to use parameterized cells (which are referred to herein as "pcells"). With pcells, a designer selects parameters to describe features of electronic components for a design of an integrated circuit. The pcell tool can then automatically generate multiple representations of the electronic components of the pcell based on the parameters. The parameterized data specified by the user minimizes the effort of data entry and editing in the design tool, and also reduces design rule violations.

Any suitable kind of design data can be parameterized in a pcell. For example, with a transistor pcell, the length, width, number of gate segments, and other design elements of the transistor, can be realized by simply inserting or changing one or more parameter values. For bipolar designs, parameterized data can include shapes such as arcs and circles. Design data can include text, and the location of the text may be relative to a virtual shape. Also, pieces of parameterized data can automatically appear, disappear, or replicate as a condition of another parameter.

Pcells have been implemented using different programming languages. For example, pcells are most commonly created using the Skill programming language. However, it may also possible to utilize other languages to create pcells, such as the Python, TCL, C, C++, and LISP programming language.

In some cases, a single organization may wish to permit usage of pcells written in different programming languages. For example, a semiconductor manufacturing/fabrication facility (often referred to as a "fab" or "foundry") may develop process development kits (PDKs) for its customers that include components to be used within an electronic design. Since the fabrication facility typically has a diverse group of customers that utilize many kinds of design software and techniques, it is quite possible that the fabrication facility will want to offer the PDK with pcell components written in multiple programming languages.

The problem is that conventional electronic design automation ("EDA") systems and tools are typically configured to only operate with pcells that are implemented using a single specific language. However, a company or organization may need to access, use, and/or distribute pcells that are created using multiple programming languages.

Therefore, there is a need for an approach that allows pcells written in different programming languages to be used by EDA tools, even if the EDA tools are not configured to natively understand the original programming language of the pcell.

SUMMARY

Embodiments of the invention provide a method and system for translating parameterized cells (pcells) that are created using different programming languages. According to one embodiment, the pcell source code created in a first programming language undergoes a translation process to translate that source code to a second programming language. The translation process involves an initial step of parsing and tokenizing the pcell source code to generate a symbolic tree. Each portion of the symbolic tree for the first language is then analyzed to identify corresponding functionality that can expressed in the second language. The translator will create equivalent syntax, functions and classes for all source code provided as part of the first-language pcells. A set of utility classes and functions will also be provided to act as mapping targets for API classes and functions that are not defined. A validation process is also provided to ensure the correctness of the translations.

Other and additional objects, features, and advantages of the invention are described in the detailed description, figures, and claims.

DETAILED DESCRIPTION

Embodiments of the invention provide a method and system for translating parameterized cells (pcells), where the pcell source code created in a first programming language undergoes a translation process to translate that source code to a second programming language. The translation process involves an initial step of parsing and tokenizing the pcell source code to generate a symbolic tree. Each portion of the symbolic tree for the first language is then analyzed to identify corresponding functionality that can expressed in the second language. The translator will create equivalent syntax, functions and classes for all source code provided as part of the first-language pcells. A set of utility classes and functions will also be provided to act as mapping targets for API classes and functions that are not defined. The goal of the translator is to have 100% complete coverage of functionality and behavior of the first language cells to complete and correct the second language pcells.

A validation process is also provided to ensure the correctness of the translations. Unlike prior translation approaches, the current invention is intended to be used in the electronic design process where it is critical that the pcell translations produce physical layouts that are exactly the same, regardless the programming language for the pcell. Some embodiments of the invention are directed to an approach for checking across a broad range of parameters for exact geometry matches between the first language pcell and the second language pcells.

Figure 1:
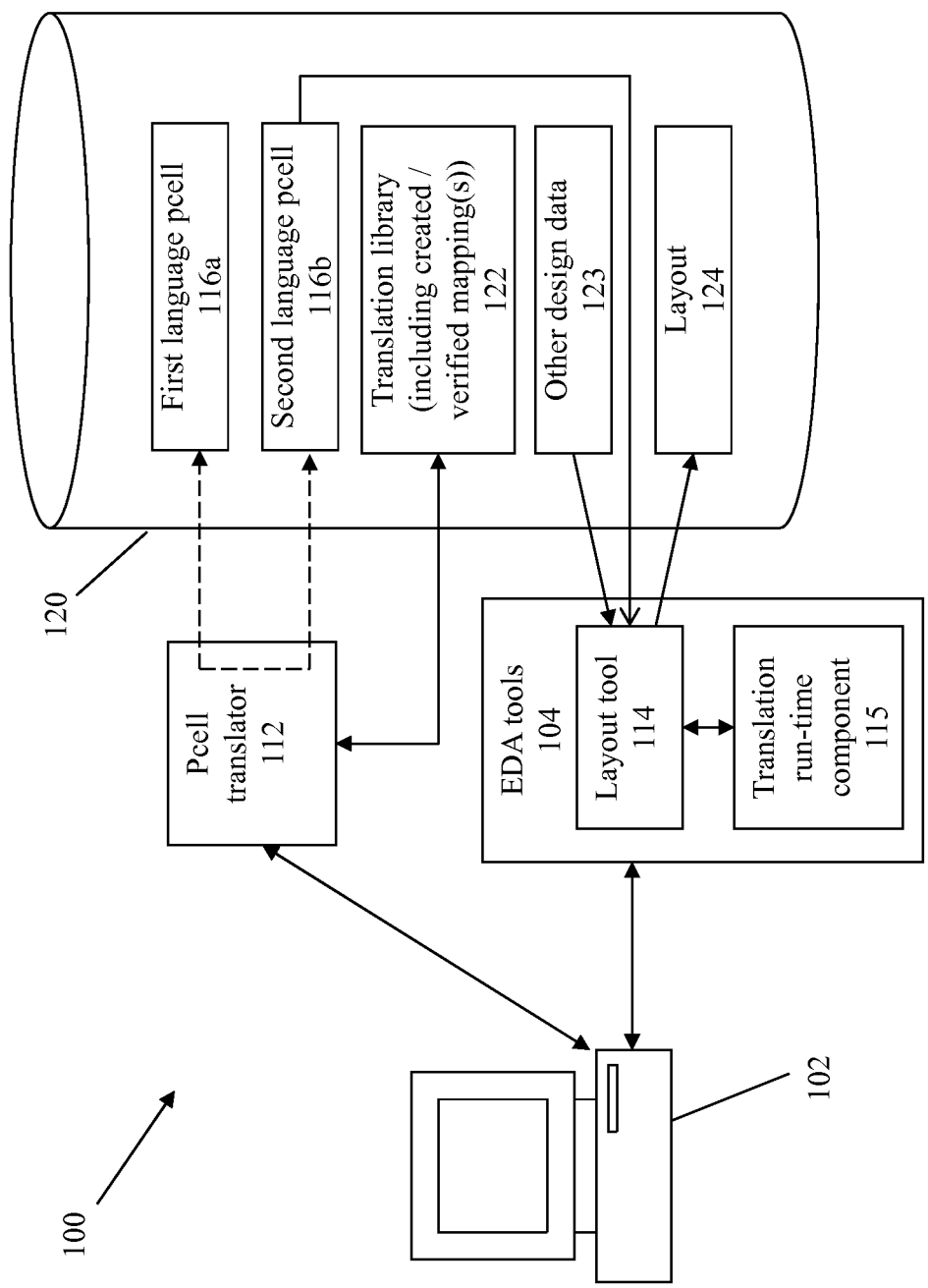
FIG. 1 depicts an architecture of a system for translating pcells according to some embodiments of the invention.

FIG. 1 illustrates an example system 100 which may be employed in some embodiments of the invention to perform translations of pcell source code from a first programming language to a second programming language. System 100 includes one or more users at one or more user stations 102 that operate the system 100 to design or edit electronic designs. Such users include, for example, design engineers or verification engineers. User station 102 comprises any type of computing station that may be used to operate, interface with, or implement EDA applications or devices. Examples of such user stations 102 include for example, workstations, personal computers, or remote computing terminals. User station 102 comprises a display device, such as a display monitor, for displaying electronic design layouts and processing results to users at the user station 102. User station 102 also comprises one or more input devices for the user to provide operational control over the activities of system 100, such as a mouse or keyboard to manipulate a pointing object in a graphical user interface.

The electronic designs may be stored in a computer readable storage device 120. Computer readable storage device 120 comprises any combination of hardware and software that allows for ready access to the data that is located at the computer readable storage device 120. For example, computer readable storage device 120 could be implemented as computer memory operatively managed by an operating system. The computer readable storage device 120 could also be implemented as an electronic database system having storage on persistent and/or non-persistent storage.

According to the present embodiment, one or more libraries containing pcell source code, such as a first language pcell source code file 116a, are placed or stored within the computer readable storage device 120.

A pcell translator 112 is employed to translate the first language pcell source code file 116a into an equivalent second language pcell source code file 116b. The translation process involves an initial step of parsing and tokenizing the pcell to generate a symbolic tree. Each portion of the symbolic tree for the first language is then analyzed to identify corresponding functionality that can expressed in the second language pcell. The translator 112 will create equivalent syntax, functions and classes for all source code provided as part of the first language pcells. A set of utility classes and functions will also be provided to act as mapping targets for API classes and functions that are not defined. A translation library 122 includes the mappings used by the pcell translator 112 to map the contents of the source code for the first language pcell 116a to the second language pcell 116b.

One or more (CAD) tool or electronic design automation (EDA) design tools 104, such as a layout tool 114, may be used by users at a user station 102 to create or edit the layout 124 of an electronic design. The layout tool 114 receives electronic design data, such as pcells and other design data 123 in a library of such design data to generate the layout 124. The design data 123 may include any additional set of information that is utilized by the layout tool 114 to generate a layout. For example, design data 123 may include PDKs, models, verification documents, standard cell libraries, and other like design materials. Any suitable data management infrastructure may be employed in conjunction with the present disclosure to implement storage of the pcells 116a, 116b and the design data 123. For example, the data can be managed by the OpenAccess product, which is available from the Website of Silicon Integration Initiative, Inc. (Si2).

It is assumed that the layout tool 114 is designed to be natively compatible with only pcells that are created in the second programming language. Therefore, any pcells 116a that have source code created in the first programming language would need to be translated by pcell translator 112 into a pcell 116b in the second programming language before it can be used by the layout tool 114.

It is possible that some language constructs in the first programming language are not directly equivalent with language constructs in the second programming language. Therefore, it is possible that a direct translation of some items or objects within the source code of the first language pcell 116a will not be completely translated into the source code of the second language pcell 116b. Instead, for these types of language constructs, a run-time component 115 may need to be present during the operation of the layout tool 114 to finalize the translation of these language constructs. In addition, for certain translation tasks, it may be more efficient to implement the translations in two parts, with a first part involving changes to the source code and a run-time component that resolves any final translation issues (such as sematic translation issues) at run-time.

For example, it is possible that certain operators in the first programming language can only be resolved at run-time, with consideration of the actual data being operated upon at that point in time. To explain, consider an overloaded operator that may be viewed differently depending upon the values being operated upon, e.g., in some languages the "+" operator is construed to implement an addition operation if acting upon numbers but can also be construed as a concatenation operation if operating on strings. If the second programming language does not have an exact equivalent of this type of language construct, then a pure source code translation may not be possible or efficient, since the values operated upon by the operator may only be known at run-time. Instead, the translation run-time component 115 can be employed to identify the specific types of values being operated upon at run-time, and to then implement the translated pcell at that point with the correct operator in the translated language version.

Of course this translation sequence could also have been implemented with a more complex algorithm in the translated source code, but there may be reasons to not do so and instead utilize the run-time component. For example, one possible reason is because there is often a desire to have the original pcell source code and the translated pcell source code to both have similar architectures and algorithmic flows, to facilitate readability and debugging of the translated version of the pcell code. Therefore, it may not be desirable to introduce complex changes to the general flow of the translated source code to handle certain types of non-equivalent language constructs (such as the overloaded operator described above) and to instead implement final semantic translations of those language constructs at run-time.

Figure 2:
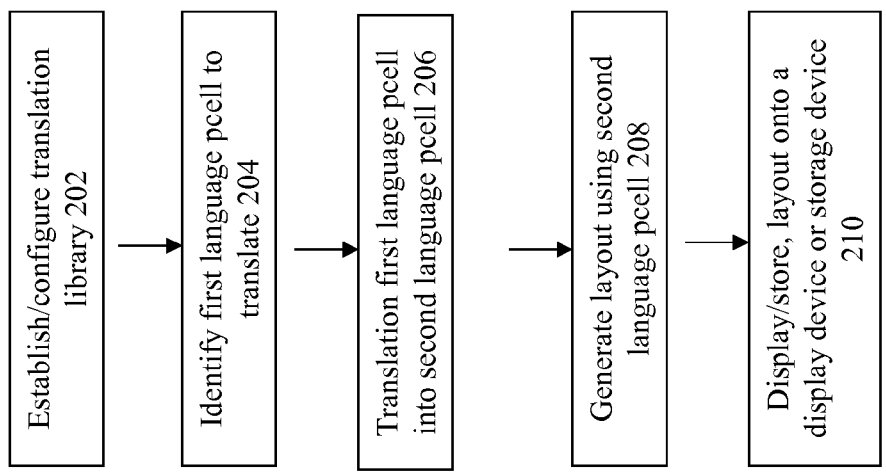
FIG. 2 illustrates a flow of an approach for translating pcells according to some embodiments of the invention.

FIG. 2 shows a high level flow of a process for implementing the inventive approach according to some embodiments of the invention. At 202, a translation library is established to perform the translations. The translation library includes all mappings between a first programming language and one or more other programming languages that permit translations of the source code of pcells from a first language to the other programming languages. To accomplish this, the translation library is configured to include the specific language constructs, such as functions, APIs, and calls, that map to the same or equivalent constructs in the different languages. In addition, the translation library will include the necessary information needed to guide the run-time translation component to finalize any translations that must be resolved at run-time.

At 204, the source code file for a first language pcell is identified which needs to be translated into a second programming language. The pcell may be in any programming language. For example, the pcell may be in the Skill, Python, TCL, LISP, or C++ programming languages, which is to be translated into any of the other programming languages. The translations may occur at any point in the electronic design flow. For example, a fabrication facility may utilize the present techniques to translate and validate pcells within a PDK prior to its release to customers. In addition, a downstream customer may wish to leverage an existing library of pcells by translating those pcells into another programming language, e.g., in the circumstance when the customer has purchased a new EDA tool that is not natively compatible with the language of the existing library of pcells.

Next, at 206, the source code in the first programming language for the pcell is translated into the second programming language. As described in more detail below, this translation functionality is performed by analyzing the details of the source code in the first programming language, and then mapping the first language constructs to constructs in the second programming language.

The pcell source code translation must take into account translations at both the syntax and semantic levels. At the syntax level, the translated source code must include comparable language constructs and objects to those that are present in the original source code. At the semantic level, the translated version of the source must have the same behavioral functionality as the original source code, particularly with respect to the exact geometries and shapes that are produced in a design layout by the pcell.

At 208, the translated pcell is used to generate a layout. A pcell/layout tool will automatically generate shapes on a design layout that are representations of electronic components within the pcell, where the exact geometries of those shapes are based on the parameters included within the pcell. At 210, the final layout can then be displayed on a display device or stored onto a computer readable medium.

Figure 3A:
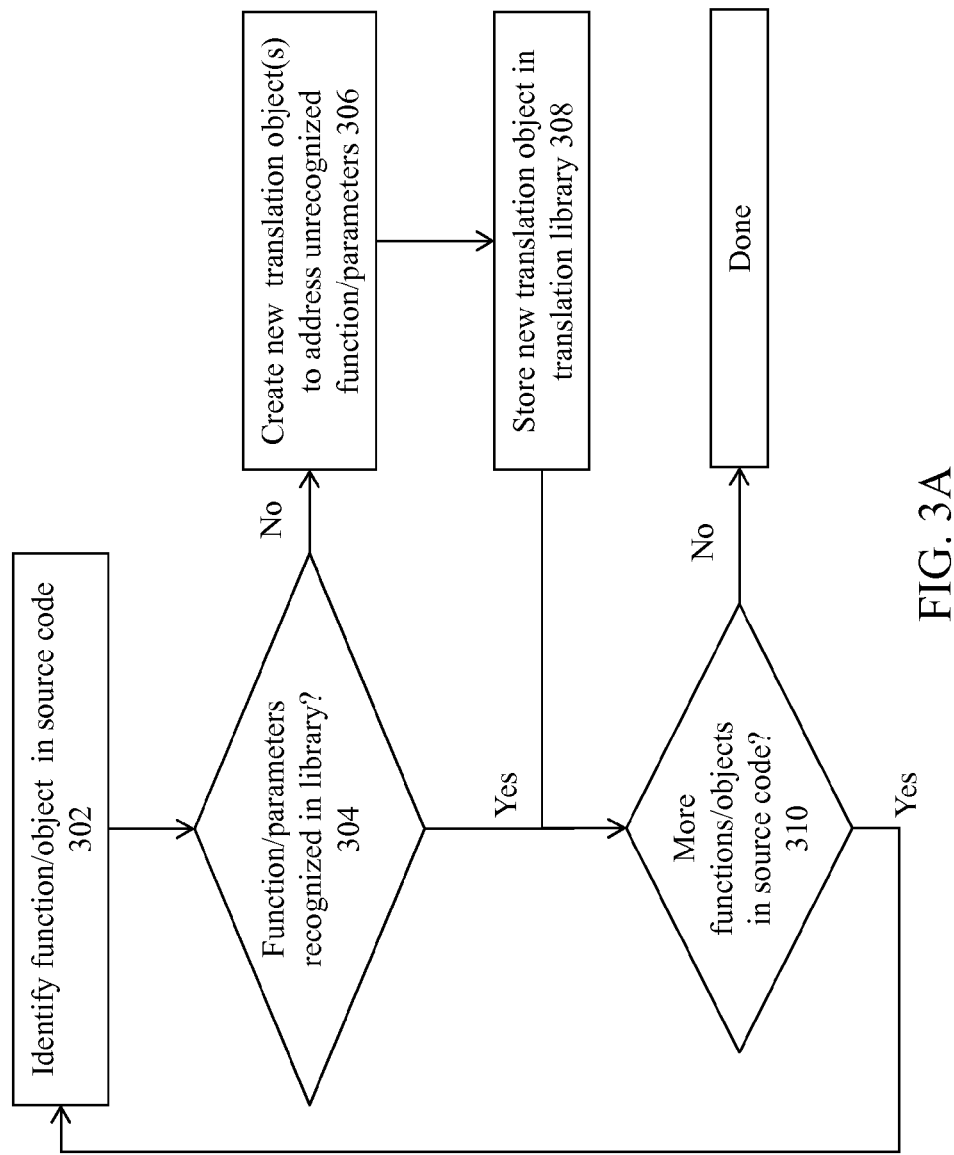
FIG. 3A illustrates a flow of an approach for configuring a translation library according to some embodiments of the invention.

FIG. 3A shows a flowchart of a process for generating the translation library according to some embodiments of the invention. At 302, the functions and/or objects that are in the pcell source code to be translated are identified. This action identifies the group of constructs in the first programming language that are expected to be in the pcell source code to be translated. One approach that can be taken to implement this step is to identify a set of example pcell source code in the first programming language, and to then to parse and tokenize that code into an abstract syntax tree (AST). The AST is then reviewed to identify the specific functions and objects that exist within the pcell source code. There are numerous ways that can be taken to generate the AST from pcell source code. For example, if the pcell source code is written in the Python language, then Python itself has built-in capabilities to generate an AST from the Python code.

At 304, a determination is made whether the identified function/object is already recognized and/or mapped in the existing translation library (e.g., because that function/object has already been recognized and addressed in the past, and suitable mappings have already been created and verified for that function/object in the translation library). If so, then at 310, the process returns back to 302 to select another function/object for translation processing.

However, if the identified functions/object is not already recognized in the translation library, then new translation mappings will need to be created in the translation library to handle the functions/object (306), with the new mappings stored in the translation library (308). The translation library will include mappings to equivalent syntax, functions and classes for the identified language constructs between a first programming language and a second programming language. A set of utility classes and functions will also be provided to act as mapping targets for API classes and functions that are not defined in the original source code. The mappings will therefore permit the translator to map a function or object in the first programming language to its equivalent function or object in the second programming language.

Figure 3B:
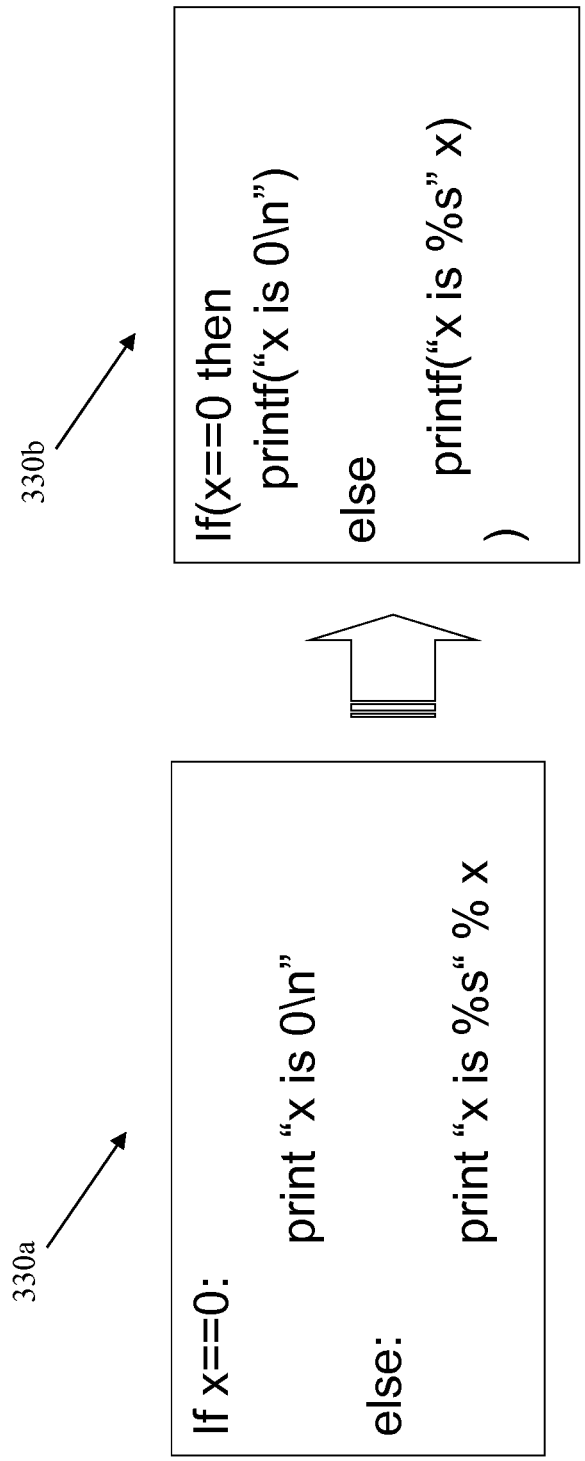
FIG. 3B illustrates an example translation according to some embodiments of the invention.

The translations/mapping will operate on at least two different levels, to address translations at both the syntax level and the semantic level. The translation will operate at the syntax level, by performing a translation of the source code form the first programming language to the second programming language so that the wording and syntax of the translated code is correctly established in the translated pcell code file. To accomplish this, the specific functions/object names in the first programming language will be translated into equivalent and consistent function/object names in the second programming language. FIG. 3B shows an example of a syntax translation of a simple code fragment from Python language to the Lisp language, where the syntax of the "if . . . then . . . " construct 330a in the Python language version is translated into the equivalent "if . . . then . . . " construct 330b in the LISP language. Function name substitution is another type of syntax translation that can be performed. In addition, application programming interfaces (APIs) can be addressed by providing equivalent APIs in the translated language.

In addition, the translations must be properly performed at the semantic level. This means that the behavior of the original pcell must be understood, and the translated version of the pcell must behaviorally operate to provide necessarily the processing results as the original language pcell. This aspect of the embodiments of the invention is critical, since pcells are intended to create geometric shapes within electronic design layouts. Therefore, the end product of the pcell are shapes on the layout that form circuit elements such as transistors, memory elements, pins, etc., that must be geometrically correct to ensure proper operation of the electronic circuit to be manufactured from the layout/pcell. If not, then the electronic circuit that is manufactured using the pcell may include defects that cause lowered or failed performance of the product that includes the electronic circuit. This aspect of the invention is quite different from other types of source code translation approaches, since alternate source code translation approaches do not need to operate in this same type of context where resulting shapes on a circuit layout must be geometrically correct and consistent. In other words, the pcell translation must be semantically correct to ensure that the translated pcell will result in a layout geometry that is identical to the layout geometry when using the original pcell in the original programming language. Therefore, even if there is a direct syntax-correct translation from a first language version to a second language version of the pcell construct, the translation must also be semantically correct to ensure that the two different pcells operate exact the same from a behavioral point of view.

One approach to ensure proper semantic translations make sure proper identifications are made of functions and/or objects in the different languages that do not perform or behave identically to each other. These functions/objects would then be addressed over and above a straightforward syntax translation. For example, a wrapper function may be provided to emulate the behavior of a language construct in the translated language. In addition, the run-time component may be employed to perform any semantic translations that are required at run-time.

The mapping that are generated and stored in the translation library may be created either manually or automatically.

In the manual approach, an engineer or programmer will analyze the syntax and intended functionality of the first language construct, and will identify or create equivalent code in the second programming language to accomplish the same results. The engineer or programmer may need to provide modified instructions for the run-time component to complete certain types of translations that need to be resolved at run-time. In the automated approach, basic building blocks are provided for handling different translation functions, and those building blocks are combined together to provide the required mapping for the translation library. For example, consider the situation when a function in the first programming language has several parameters that need to be processed in a certain order. The automated mapping approach may first identify the equivalent function or set of functions in the second programming language, and can then analyze those parameters to determine an order in which those parameters should be applied to the function(s) in the second programming language.

The new mappings are stored in the translation library (308). This allows the translation library to grow over time with new mappings, so that future translation efforts are capable of addressing any translation needs that have already been handled in the past.

Some embodiments of the invention provide a method and mechanism to perform translation validations to ensure that the proposed mappings for the translation library will create translated pcells that are semantically correct. The validation activity should ensure that the geometry of the translated pcell exactly matches the geometry of the original pcell.

Figure 4:
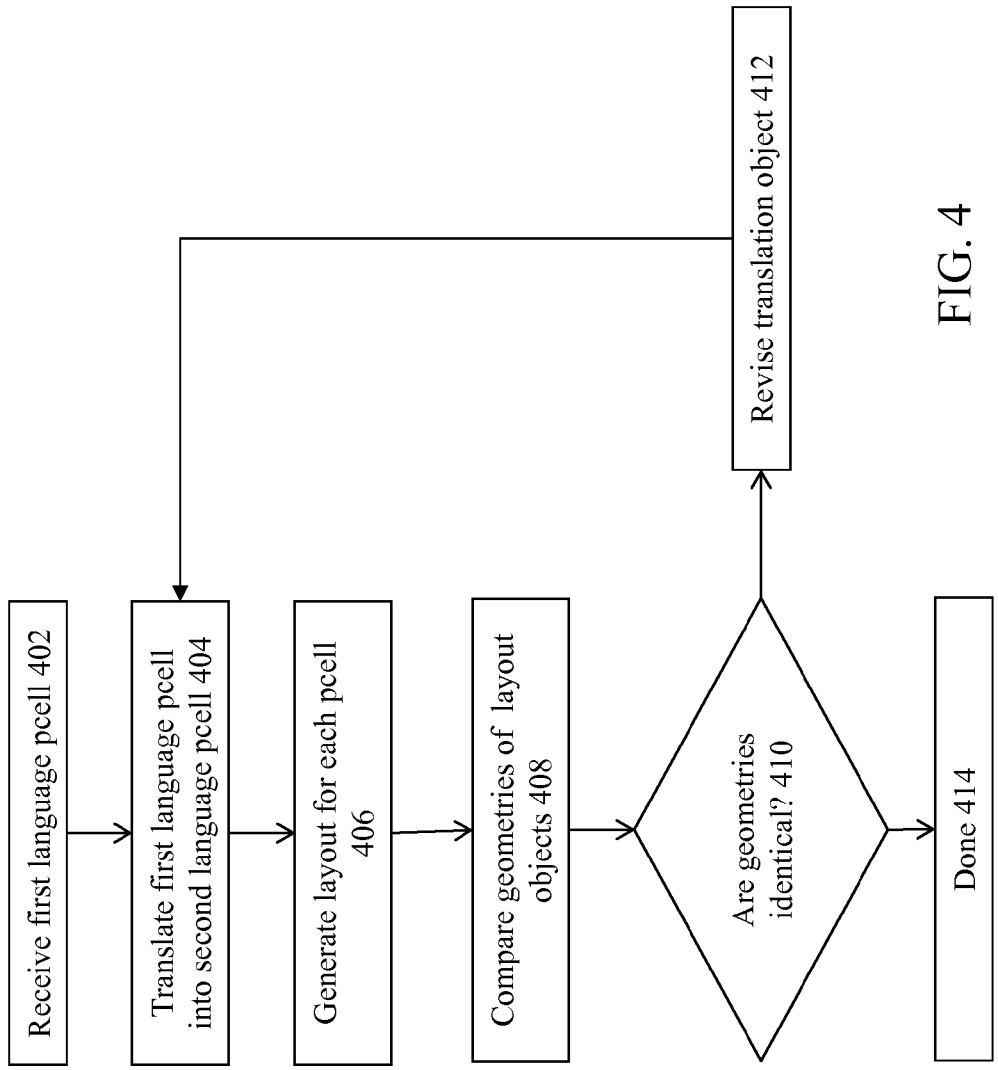
FIG. 4 illustrates a flow of an approach for validating pcell translations according to some embodiments of the invention.

FIG. 4 shows a flowchart of a process for validating the translation of a pcell according to some embodiments of the invention. At 402, the source code of the pcell in the first language is received. At 404, that first language pcell is translated into source code fro the second programming language.

At 406, a layout is generated for both the original pcell and the translated pcell. This action can be performed, for example, by installing the original pcell into a first library and the translated pcell into a second library (which may refer to the original library for technology information). Each pcell is then instantiated into separate cell views, where the pcells are instantiated using a range of unique combinations of parameters to be tested.

At 408, the geometries of both sets of pcell instantiations are compared to check whether the geometries are identical. This may be performed, for example, by flattening each instance of the pcells to basic shapes, while retaining pins and connectivity. An exclusive OR operation may be performed to check for any differences between the two pcell instances. At 410, a determination can be made whether the geometries are identical. If the geometries are not identical, then at 412 the translation mapping in the translation library must be modified to address the discrepancies. Otherwise, if the two sets of geometries are identical, then at 414 the process ends since the translations are correct.

The validations may also be performed to check for other types of consistencies/inconsistencies with the translations. For example, further validations may be performed to check that the translated pcell interacts with the layout/pcell application as well as the original pcell, e.g., with respect to data above the geometric layer, such as connectivity/pins, automatic abutment functionality, and to stretch handles. For this type of validation, one may assume that the interaction of the pcell with the layout/pcell application is somewhat independent of the parameters being specified. Therefore, there may not be a need to exhaustively test all variations of parameters on the pcell instances and check that the connectivity is correct. Instead, only a few subsets (e.g., one finger, and multi-fingers for example) may need to be tested.

Figure 5:
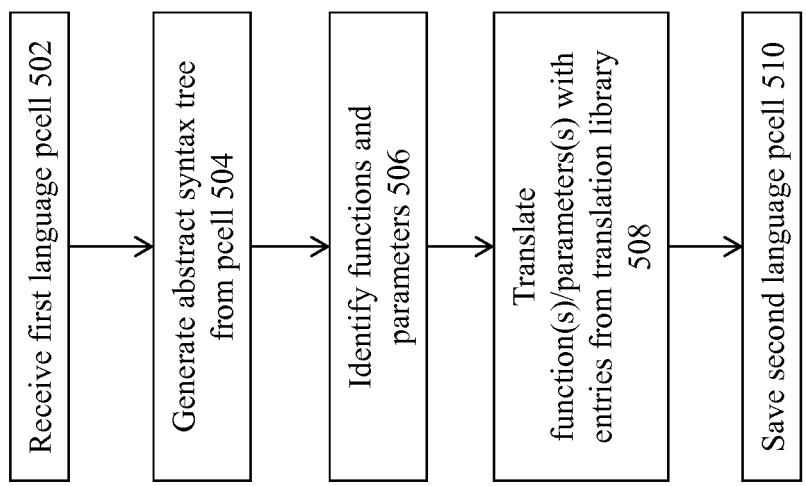
FIG. 5 illustrates a flow of an approach for implementing pcell translations according to some embodiments of the invention.

FIG. 5 shows a flowchart of a process for performing the actual translations of the pcell source code. At 502, the source code for the pcell in the first programming language is received. At 504, an abstract syntax tree (AST) is generated for the source code for the pcell. This can be accomplished using the approach described above, e.g., using the built-in AST capabilities of the Python language if the pcell source code is in this programming language.

From the AST, the functions/objects within the first language pcell are identified (506). The translation library is accessed at 508 to translate each portion of the source code in the first programming language into the second language. Thereafter, the source code for the second language version of the pcell is saved at 510.

Therefore, what has been described is an approach for enabling parameterized cells that have been created in a first programming language to be translated into a second programming language.

The embodiments of the invention may be applied in any context to generate translated pcells. For example, the invention may be applied to deliver PDKs having pcells that correspond to different programming languages, where a given pcell in a first language is replicated as a pcell in a second language within the technology library of the PDK. This allows the customer of the fabrication facility (which had provided the PDK) to use any layout tool desired by the customer and still allow the customer to work with pcells in the PDK, even if the selected layout tool is configured to natively recognize pcells of only a single programming language so long as that language is supported by the PDK. The two libraries of pcells in the PDK would contain duplicated symbols, schematics, and other information for pcells that have been translated from one language to another. Nevertheless, this permits the creator of a pcell in a first language to leverage that pcell, and make that data useful for users of pcells in other languages.

System Architecture Overview

Figure 6:
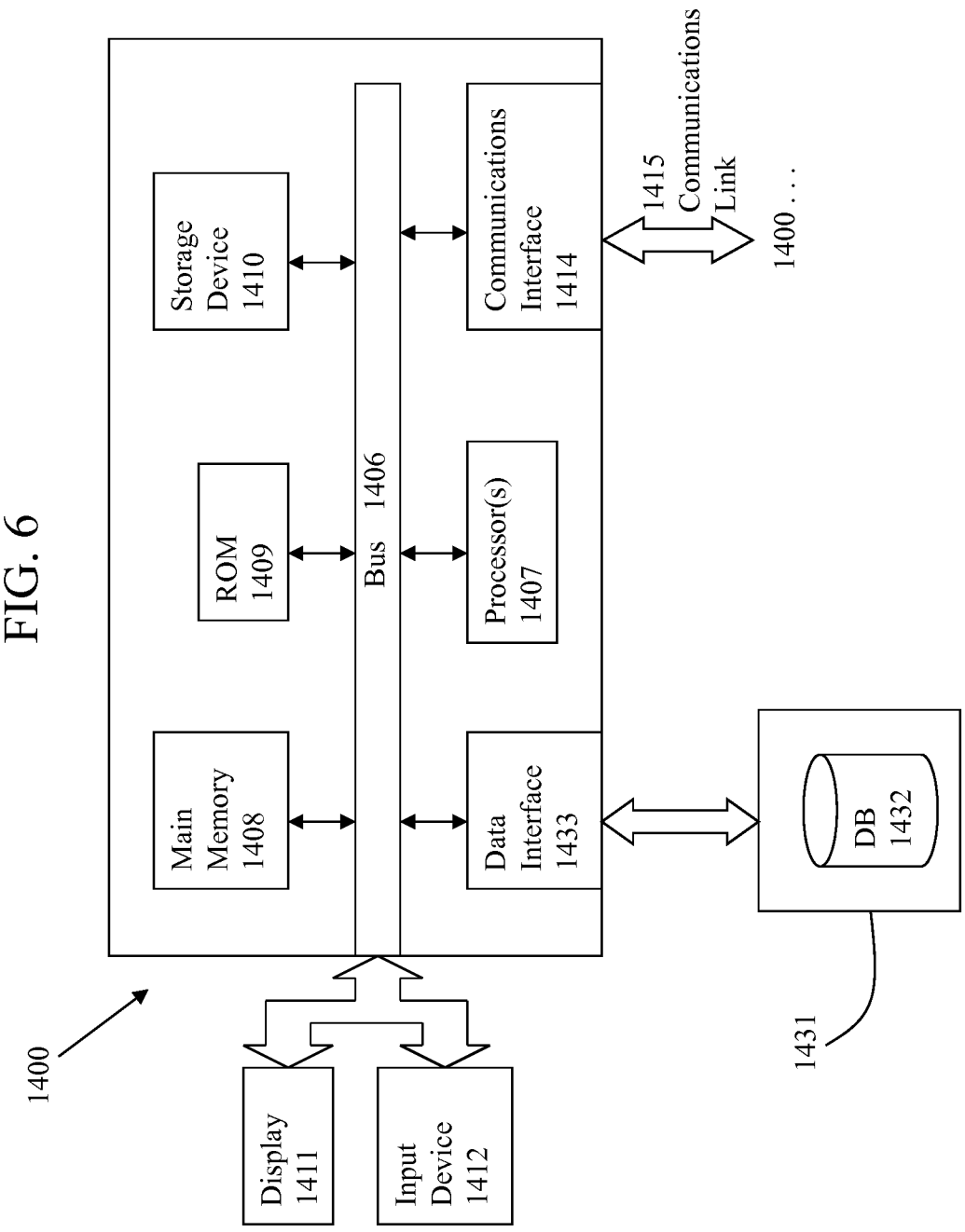
FIG. 6 shows an architecture of an example computing system with which the invention may be implemented.

FIG. 6 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

The invention claimed is:

1. A computer implemented method implemented with a processor, the method comprising:
   identifying, by a computer comprising at least one processor, a first source code in a first programming language for a parameterized cell;
   determining a language construct in the first programming language for the parameterized cell;
   identifying, with a parameterized cell translation module that is configured to include or function in conjunction with the at least one processor, a mapping for the language construct in the first programming language to translate the language construct into an equivalent construct in a second programming language; and
   translating, with the mapping, the language construct in the first programming language to the equivalent construct in the second programming language to generate the second source code, which comprises a translated version of the first source code, for the parameterized cell in the second programming language by tokenizing the first source code that breaks the first source code into multiple, smaller elements for the parameterized cell; and
   verifying correctness of the mapping by determining whether a first layout and a second layout of the parameterized cell are geometrically identical by performing an exclusive OR operation between the first layout corresponding to the language construct and the second layout corresponding to the equivalent construct, wherein
   the correctness of the mapping is verified to determine whether the language construct in the first source code written in the first programming language and the equivalent construct in a second source code written in the second programming language are semantically correct.

2. The method of claim 1, further comprising checking interactions with a layout application for the first parameterized cell layout and the second parameterized cell layout.

3. The method of claim 2, further comprising checking the interactions with respect to data above a geometric layer.

4. The method of claim 1, in which the mapping is stored in a translation library.

5. The method of claim 1, in which the mapping corresponds to equivalent syntax, functions and classes between the first programming language and the second programming language.

6. The method of claim 1, in which the mapping corresponds to a set of utility classes and functions to act as mapping targets for API classes and functions.

7. The method of claim 1, in which a run-time component is employed at run-time to finalize the translation of the language construct in the first programming language to the equivalent construct in the second programming language.

8. The method of claim 7, in which the run-time component is called by a layout tool to generate a layout using the translated version of the first source code for the parameterized cell in the second programming language.

9. A computer program product embodied on a non-transitory computer usable medium, the non-transitory computer usable medium having stored thereon a computer program which, when executed by a processor causes the processor to execute a set of acts, the computer program comprising:
   a set of instructions executable to identify a first source code in a first programming language for a parameterized cell;
   a set of instructions executable to determine a language construct in the first programming language for the parameterized cell;
   a set of instructions executable to identify a mapping for the language construct in the first programming language to translate the language construct into an equivalent construct in a second programming language; and
   a set of instructions executable to translate, with the mapping, the language construct in the first programming language to the equivalent construct in the second programming language to generate the second source code, which is a translated version of the first source code, for the parameterized cell in the second programming language by tokenizing the first source code that breaks the first source code into multiple, smaller elements for the parameterized cell; and
   a set of instructions executable to verify correctness of the mapping by determining whether a first layout and a second layout of the parameterized cell are geometrically identical by performing an exclusive OR operation between the first layout corresponding to the language construct and the second layout corresponding to the equivalent construct, wherein
   the correctness of the mapping is verified to determine whether the language construct in the first source code written in the first programming language and the equivalent construct in a second source code written in the second programming language are semantically correct.

10. The computer program product of claim 9, the computer program further comprising a sequence of instructions executable to check interactions with a layout application for the first parameterized cell layout and the second parameterized cell layout.

11. The computer program product of claim 10, the computer program further comprising a sequence of instructions executable to check the interactions with respect to data above a geometric layer.

12. The computer program product of claim 9, in which the mapping is stored in a translation library.

13. The computer program product of claim 9, in which the mapping corresponds to equivalent syntax, functions and classes between the first programming language and the second programming language.

14. The computer program product of claim 9, in which the mapping corresponds to a set of utility classes and functions to act as mapping targets for API classes and functions.

15. The computer program product of claim 9, in which a run-time component is employed at run-time to finalize the translation of the language construct in the first programming language to the equivalent construct in the second programming language.

16. The computer program product of claim 15, in which the run-time component is called by a layout tool to generate a layout using the translated version of the first source code for the parameterized cell in the second programming language.

17. A system for performing translations of source code for parameterized cells, comprising:
a processor that executes sets of instructions; and
a memory storing programmable code, wherein the programmable code includes the sets of instructions which, when executed by the processor, cause the processor to at least:
identify a first source code in a first programming language for a parameterized cell;
determine a language construct in the first programming language for the parameterized cell;
identify a mapping for the language construct in the first programming language to translate the language construct into an equivalent construct in a second programming language;
translate, with the mapping, the language construct in the first programming language to the equivalent construct in the second programming language to generate the second source code, which comprises a translated version of the first source code, for the parameterized cell in the second programming language by tokenizing the first source code that breaks the first source code into multiple, smaller elements for the parameterized cell; and
a parameterized cell translation module that is configured to include or function in conjunction with the processor to:
verify correctness of the mapping by determining whether a first layout and a second layout of the parameterized cell are geometrically identical by performing an exclusive OR operation between the first layout corresponding to the language construct and the second layout corresponding to the equivalent construct, wherein
the correctness of the mapping is verified to determine whether the language construct in the first source code written in the first programming language and the equivalent construct in a second source code written in the second programming language are semantically correct.

18. The system of claim 17, the programmable code including the instructions which, when executed by the processor, further cause the processor to check interactions with a layout application for the first parameterized cell layout and the second parameterized cell layout.

19. The system of claim 18, the programmable code including the instructions which, when executed by the processor, further cause the processor to check the interactions with respect to data above a geometric layer.

20. The system of claim 17, in which the mapping is stored in a translation library.

21. The system of claim 17, in which the mapping corresponds to equivalent syntax, functions and classes between the first programming language and the second programming language.

22. The system of claim 17, in which the mapping corresponds to a set of utility classes and functions to act as mapping targets for API classes and functions.

23. The system of claim 17, in which a run-time component is employed at run-time to finalize the translation of the language construct in the first programming language to the equivalent construct in the second programming language.

24. The system of claim 23, in which the run-time component is called by a layout tool to generate a layout using the translated version of the first source code for the parameterized cell in the second programming language.

* * * * *